US011374655B1

(12) United States Patent
Mazzini et al.

(10) Patent No.: US 11,374,655 B1
(45) Date of Patent: Jun. 28, 2022

(54) CONFIGURABLE LINK EXTENDER IN SMALL FORM FACTOR

(71) Applicant: Cisco Technology, Inc., San Jose, CA (US)

(72) Inventors: Marco Mazzini, Seville (ES); Alberto Cervasio, Cuorgne' (IT); Jock T. Bovington, La Mesa, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 17/303,934

(22) Filed: Jun. 10, 2021

(51) Int. Cl.
*H04B 10/40* (2013.01)
*H01S 5/50* (2006.01)
*H04B 10/2513* (2013.01)
*H04B 10/50* (2013.01)
*H04B 10/079* (2013.01)
*H04B 10/43* (2013.01)
*H04B 10/60* (2013.01)
*H04B 10/61* (2013.01)
*H04B 10/2507* (2013.01)
*H04B 10/25* (2013.01)

(52) U.S. Cl.
CPC .......... *H04B 10/40* (2013.01); *H01S 5/5036* (2013.01); *H04B 10/2513* (2013.01); *H04B 10/07951* (2013.01); *H04B 10/25* (2013.01); *H04B 10/2507* (2013.01); *H04B 10/43* (2013.01); *H04B 10/50* (2013.01); *H04B 10/60* (2013.01); *H04B 10/6161* (2013.01)

(58) Field of Classification Search
None
See application file for complete search history.

(56) References Cited

U.S. PATENT DOCUMENTS

| | | | | |
|---|---|---|---|---|
| 5,812,710 A * | 9/1998 | Sugaya | ................ | H01S 3/1301 385/27 |
| 7,215,464 B1 * | 5/2007 | Komaki | ............... | H04B 10/296 359/337.5 |
| 2002/0191275 A1 * | 12/2002 | Kinoshita | ........... | H01S 3/13013 359/337.5 |
| 2005/0111848 A1 * | 5/2005 | Grubb | ................ | H04J 14/0221 398/147 |
| 2005/0238360 A1 * | 10/2005 | Taylor | .................... | H04B 10/40 398/138 |

(Continued)

OTHER PUBLICATIONS

Sui, "Fast and Robust Blind Chromatic Dispersion Estimatin Using Auto Correlation of Signal Power Waveform for Digital Coherent Systems", Journal of Lightwave Technology, vol. 31, No. 2, Jan. 15, 2013, pp. 306-312 (Year: 2013).*

(Continued)

*Primary Examiner* — Darren E Wolf
(74) *Attorney, Agent, or Firm* — Patterson + Sheridan, LLP

(57) ABSTRACT

A link extender configured to extend a range of an optical transceiver module is provided. The link extender includes an array of semiconductor optical amplifiers (SOAs) configured to amplify an optical signal received from the optical transceiver module, a first plurality of variable optical attenuators (VOAs) configured to control a power output of the amplified optical signal output from the array of SOAs, and a plurality of dispersion compensation and filtering (DC&F) devices configured to compensate for chromatic dispersion of the optical signal.

20 Claims, 6 Drawing Sheets

(56) References Cited

U.S. PATENT DOCUMENTS

| | | | |
|---|---|---|---|
| 2007/0092259 A1* | 4/2007 | Bontu | H04B 10/6162 398/147 |
| 2007/0201785 A1 | 8/2007 | Welch et al. | |
| 2008/0260077 A1* | 10/2008 | Poirrier | H04B 10/07951 375/346 |
| 2010/0021179 A1* | 1/2010 | Kikuchi | H04B 10/65 398/183 |
| 2010/0189445 A1* | 7/2010 | Nakashima | H04B 10/614 398/152 |
| 2012/0263456 A1* | 10/2012 | Tanaka | H04B 10/5055 398/25 |
| 2014/0210354 A1* | 7/2014 | Tan | H05B 45/58 315/151 |
| 2016/0328211 A1* | 11/2016 | Nordholt | G06F 7/588 |
| 2019/0140765 A1 | 5/2019 | Ghuman | |
| 2020/0252699 A1 | 8/2020 | Ghuman | |

OTHER PUBLICATIONS

Ouang Trung Le et al., "TDM/DWDM PON Extender For 10 Gbit/s Downstream Transmission," ResearchGate, Sep. 2011, 3 pages.

* cited by examiner

CONFIGURABLE LINK EXTENDER IN SMALL FORM FACTOR

TECHNICAL FIELD

Embodiments presented in this disclosure generally relate to optical amplifiers. More specifically, embodiments disclosed herein relate to a configurable optical link extender in a small form factor.

BACKGROUND

As communications platforms include ever greater bandwidth on existing channels, tradeoffs are made in the signal characteristics to accommodate the greater bandwidth. For example, Pulse Amplitude Modulation (PAM) divides available signaling space into several amplitude ranges to increase signaling bandwidth by having several potential values defined at several potential amplitudes rather than two values (e.g., 0 at minima and 1 at maxima). Data center interconnect (DCI) applications and other optical transceiver applications can use PAM-based optical interfaces to support optical communications over link distances up to 10 kilometers (km) for 100 Gigabits per second (Gbps) and 6 km for 400 Gbps.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate typical embodiments and are therefore not to be considered limiting; other equally effective embodiments are contemplated.

To facilitate understanding, identical reference numerals have been used, where possible, to designate identical elements that are common to the figures. It is contemplated that elements disclosed in one embodiment may be beneficially used in other embodiments without specific recitation.

DESCRIPTION OF EXAMPLE EMBODIMENTS

Overview

Figure 1:
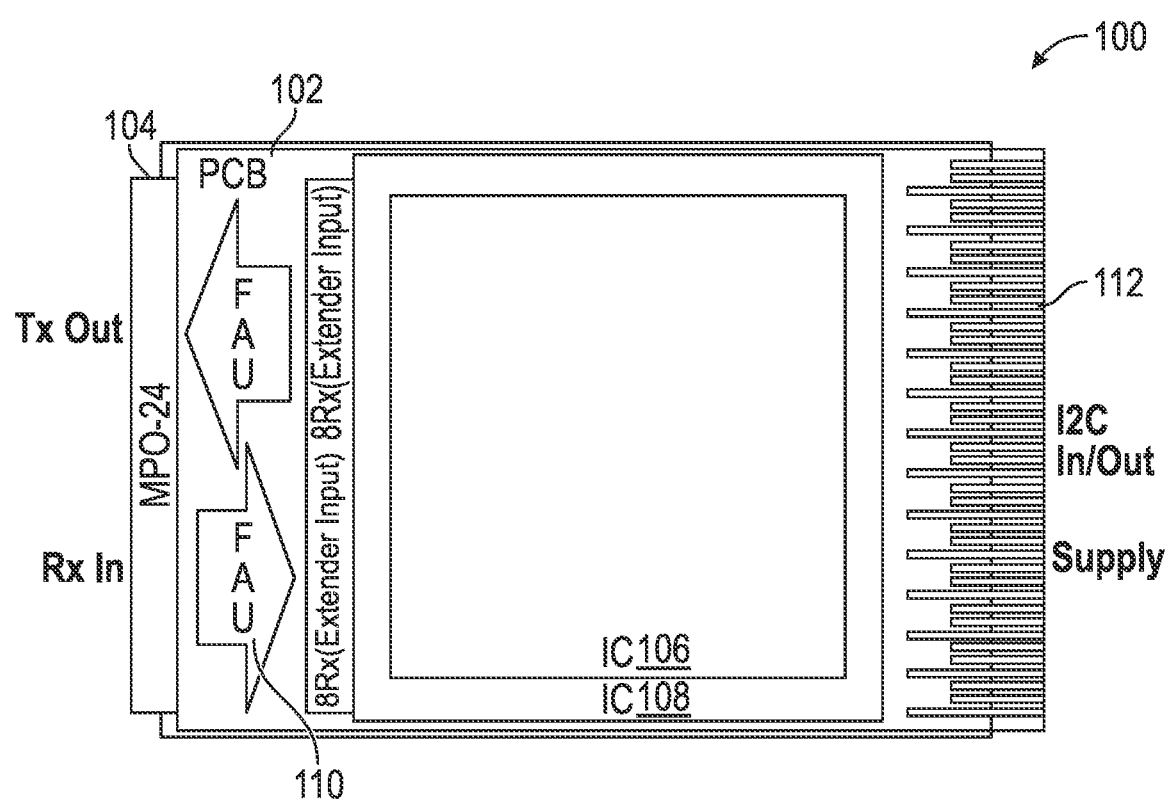
FIG. 1 illustrates a link extender module in an optical system, according to embodiments of the present disclosure.

One embodiment presented in this disclosure is an apparatus configured to extend a range of an optical transceiver module. The apparatus includes an array of semiconductor optical amplifiers (SOAs) configured to amplify an optical signal received from the optical transceiver module. The apparatus also includes a first plurality of variable optical attenuators (VOAs) configured to control a power output of the amplified optical signal output from the array of SOAs. The apparatus further includes a plurality of dispersion compensation and filtering (DC&F) devices configured to compensate for chromatic dispersion of the optical signal.

Another embodiment presented in this disclosure is an optical system. The optical system includes a first transceiver module, a second transceiver module, and an apparatus. The apparatus is configured to receive a first optical signal from the first transceiver module, amplify the first optical signal using at least an array of semiconductor optical amplifiers (SOAs), and transmit the amplified first optical signal to the second transceiver module. The apparatus includes the array of SOAs, a first plurality of variable optical attenuators (VOAs) configured to control a power output of the amplified first optical signal, and a plurality of dispersion compensation and filtering (DC&F) devices configured to compensate for chromatic dispersion of the first optical signal.

Another embodiment presented in this disclosure is a method for extending a range of a first transceiver module. The method includes receiving, by a link extender apparatus, a first optical signal from the first transceiver module. The method also includes amplifying, by the link extender apparatus, the first optical signal using at least an array of semiconductor optical amplifiers (SOAs). The method further includes transmitting, by the link extender apparatus, the amplified first optical signal to a second transceiver module. The link extender apparatus includes the array of SOAs, a first plurality of variable optical attenuators (VOAs) configured to control a power output of the amplified first optical signal, and a plurality of dispersion compensation and filtering (DC&F) devices configured to compensate for chromatic dispersion of the first optical signal.

Example Embodiments

Conventional optical transceiver applications can generally support optical communications over link distances up to several kilometers, depending on the bandwidth supported by the link. However, as the demand for telecommunications services continues to increase, providers are seeking to support optical communications over increasing longer distances. It can take a significant amount of time, cost, and effort to design an optical transceiver to support optical communications over longer distances (e.g., in the order of tens of kilometers).

Embodiments described herein provide an integrated configurable link extender module that is configured to extend a range of an optical transceiver module. As described below, the link extender module described herein can allow for configurable dispersion compensation and configurable amplification within a single subsystem. The link extender module can be dynamically configured to apply to different link lengths and/or link characteristics.

In one embodiment described herein, the link extender module includes an array of semiconductor optical amplifiers (SOAs) embedded into a Silicon Photonics (SiP) structure. The SiP structure also includes polarization control, switching, variable optical attenuation (VOA), and dispersion compensation and filtering. In this manner, embodiments can provide an integrated range-extender for existing short-range modules.

FIG. 1 illustrates a link extender module 100 formed in an optical system containing a SiP structure (or integrated circuit (IC) package), according to one embodiment described herein. In one embodiment, the link extender module 100 is configured to amplify signals in the O-band. The link extender module 100 can be configured to amplify signal(s) at one or more different amplification levels. In this embodiment, the link extender module 100 (which is one example of a photonic device) is formed using optical components disposed on a printed circuit board (PCB) 102. As shown, the link extender module 100 includes a fiber connector 104, a fiber attachment unit (FAU) 110, an interface 112, a semiconductor chip 108 (or chip or integrated circuit (IC)), and a semiconductor chip 106 (or chip or IC).

In this particular embodiment, the fiber connector 104 is configured to deliver the optical signal (from an optical transceiver module (not shown)) into and out of the link extender module 100, through the FAU 110. In one example, the fiber connector 104 can be a single multi-fiber push-on (MPO) connector (e.g., MPO-24 fiber connector). The FAU 110 can be a single FAU (e.g., single 16-fiber FAU) having a first set of inputs (e.g., 8 inputs) dedicated to the receiver of the link extender module 100 (e.g., link extender module input) and having a second set of inputs (e.g., 8 inputs) dedicated to the transmitter of the link extender module 100 (e.g., link extender module output).

The interface 112 generally provides a communications interface and/or power supply for the link extender module 100. For example, the interface 112 can include a communications interface (e.g., serial interface, such as an I2C bus) configured to exchange communications between the link extender module 100 and a host. The control and/or monitoring of the link extender module 100 can be performed via the interface 112. The interface 112 can also be used to supply power to the link extender module 100.

The semiconductor chip 108 includes one or more optical components that allow for configurable amplification of an optical signal received by the link extender module 100 and/or allow for configurable dispersion compensation within the link extender module 100. In some embodiments described below, for example, the semiconductor chip 108 can include an array of SOAs embedded (or bonded) on the semiconductor chip 108 that are configured to amplify the optical signal received from the FAU 110. Additionally, the semiconductor chip 108 can provide optical power control (PC), switching, VOA, and dispersion compensation and filtering (DC&F) to create an configurable integrated range extender for existing short range modules. For example, the array of SOAs can be controlled, via the semiconductor chip 108, to amplify the optical signal at different amplification levels, so that the link extender module 100 can be applied to different link lengths. The semiconductor chip 108 can independently configure the amplification of each channel of the optical signal. The semiconductor chip 108 is described in more detail below.

The semiconductor chip 106 is generally configured to drive one or more components of the link extender module 100, including, for example, the semiconductor chip 108. In some embodiments, the semiconductor chip 106 may allow a user to monitor the link extender module's input power and/or output power for each channel, monitor the input and output to the SOA(s), etc. In some embodiments, the semiconductor chip 106 may allow a user to configure/set one or more operating parameters (e.g., gain, input power, SOA current, etc.) of the link extender module 100. In some embodiments, the semiconductor chip 106 may allow a user to configure/set alarms, based on one or more operating parameters (e.g., temperature, input power, etc.).

Note that FIG. 1 illustrates a reference example configuration of a link extender module 100 and that, in other embodiments, the link extender module 100 can have other configurations or form factors consistent with the functionality described herein. For example, in other embodiments, the link extender module 100 can include an optical connector on the host side of the link extender module 100.

Figure 2:
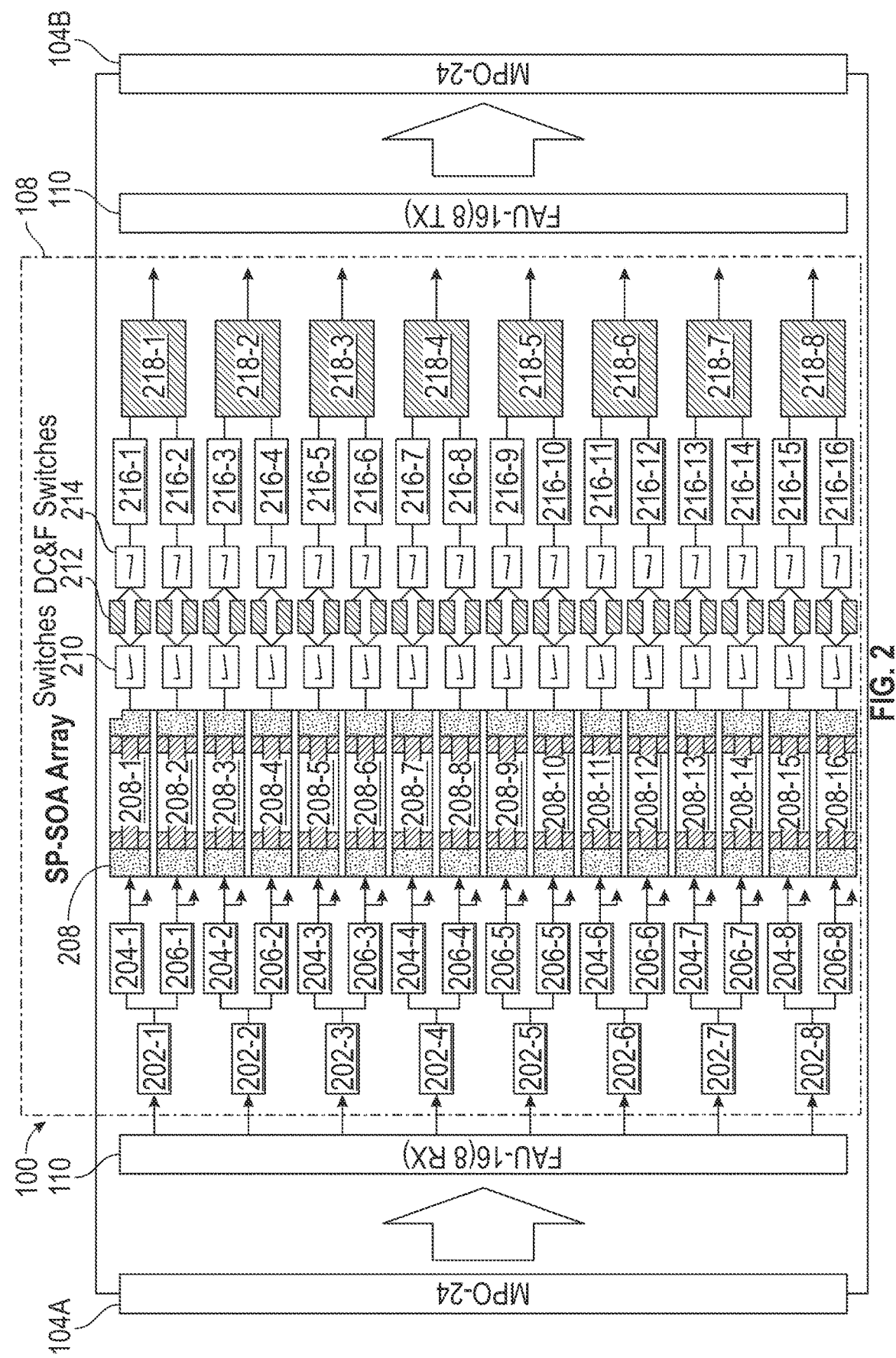
FIG. 2 is a block diagram of an implementation of the link extender module depicted in FIG. 1, according to embodiments of the present disclosure.

FIG. 2 is a block diagram of an example implementation of the link extender module 100, according to one embodiment. In one embodiment, the link extender module 100 depicted in FIG. 2 is implemented using a single-polarization SOA array (e.g., SP-SOA array). Here, the fiber connector 104 may receive an input optical signal (with 8 channels, for example) from an optical transceiver module (not shown). Note, for the sake of clarity, the single fiber connector 104 is depicted with two blocks 104A and 104B.

The input optical signal flows from the fiber connector 104 to the semiconductor chip 108 via the FAU 110. In this embodiment, the semiconductor chip 108 includes a stage of eight polarization state rotator (PSRs) (PSRs 202 1-8), a first block of input variable optical attenuators (VOAs) 204 1-8 and a second block of input VOAs 206 1-8, a SP-SOA array 208 with SOAs 208 1-16, a switch section 210, a compensation stage 212, a switch section 214, a block of output VOAs 216 1-16, and a multiplexer stage 218 (with multiplexers 218 1-8).

The input optical signal may flow through the FAU 110 into the stage of PSRs 202 1-8, where each PSR 202 is associated with a different channel of the input optical signal. Each PSR 202 is configured to rotate a polarization mode of a respective channel of the input optical signal. In this embodiment, for example, each PSR 202 is configured to rotate a transverse magnetic (TM) polarization mode into a transverse electric (TE) polarization mode. The first block of input VOAs 204 1-8 are used for the TE polarization mode of the input optical signal and the second block of input VOAs 206 1-8 are used for the converted TM mode. The input VOAs 204 1-8 are configured to control the input power to SOAs 208-1, 208-3, 208-5, 208-7, 208-9, 208-11, 208-13, 208-15, and 208-17, respectively. Similarly, the input VOAs 206 1-8 are configured to control the input power to SOAs 208-2, 208-4, 208-6, 208-8, 208-10, 208-12, 208-14, and 208-16, respectively. Each input VOA 204, 206 may control the input power to a respective SOA to help avoid saturation of the SOA, for example, when the link is shorter than the maximum reach (or range) that is specified. Additionally, each input VOA 204, 206 can control the input power to independently configure (or control) the amplification level of the respective SOA. This configuration, in turn, allows the amplification of each channel of the optical signal input into the link extender module 100 to be independently configured. Note, although not shown in FIG. 2, a monitor port may be present at each SOA input, so that a user or an automatic algorithm can set and track the input power, e.g., via the semiconductor chip 108.

After the SP-SOA array 208, the switch section 210 is used to enable the compensation stage 212. As shown in FIG. 2, for example, a switch is included for each SOA 208 1-16. The compensation stage 212 includes a set of DC&F devices, each configured to compensate for a predefined (or configured) amount of dispersion (e.g., ±40 ps/nm dispersion). The DC&F devices can include a set of integrated counter directional grating couplers. For example, the compensation stage 212 may leverage a multi-mode waveguide with a dual mode grating coupler. The dual mode grating coupler may couple specific wavelengths of the fundamental mode into a higher order mode, which propagates in the opposite direction and can be selectively coupled into an output waveguide to create a two-port DC&F device. In this manner, the compensation stage 212 can allow for both filtering and dispersion compensation. In some embodiments, leveraging multi-mode fiber based dispersion compensators (as opposed to single mode fiber based dispersion compensators) the compensation stage 212 can be implemented without a circulator. This, in turn, may allow the fiber to be integrated in the monolithic SiP platform with the VOAs, switches, and polarization management with low loss and cost.

After the compensation stage 212, a second set of switches 214 is used to close the path and connect to the output VOAs 216 1-16. Although not shown in FIG. 2, a monitor port may be present at each output VOA, so that a user or an automatic algorithm can track the output power, e.g., via the semiconductor chip 108. A multiplexer stage 218 then delivers the amplified optical signal to the fiber connector 104 via the FAU 110.

Figure 3:
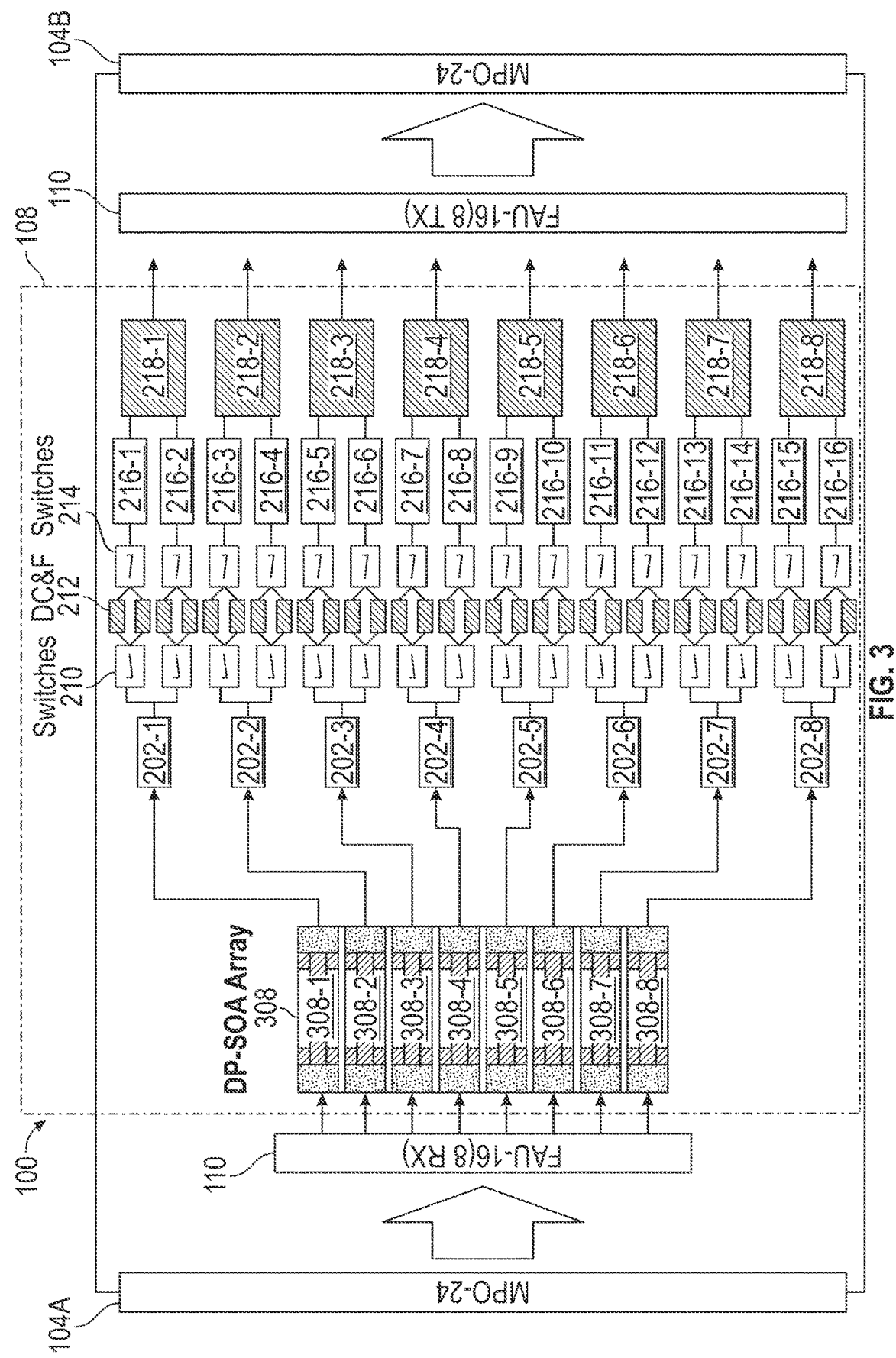
FIG. 3 is a block diagram of another implementation of the link extender module depicted in FIG. 1, according to embodiments of the present disclosure.

FIG. 3 is a block diagram of another example implementation of the link extender module 100, according to one embodiment. Compared to FIG. 2, here the link extender module 100 can be implemented using a dual-polarization SOA array (e.g., DP-SOA array). For example, the link extender module 100 includes a DP-SOA 308 with eight SOAs 308 1-8. The output from each SOA 308 is fed into a respective PSR 202. The switches 210 are used to enable the compensation stage 212 (with multiple two-port DC&F devices) and the switches 214 are used to connect to the output VOAs 216 1-16. In some embodiments, the compensation stage 212 may also act as an amplified spontaneous emission (ASE) filter, filtering out ASE from the SOA stage.

In the embodiment depicted in FIG. 3, the output VOAs 216 can be used to keep constant output power control through an output monitor to compensate for polarization dependent gain (PDG) effects. Since this embodiment does not include input VOAs, the control mechanism can involve a direct management of the input power through a feedback from the transmitting optical laser (not shown). In another embodiment, the control mechanism can involve SOA current regulation.

In some embodiments, the link extender module 100 (e.g., in FIGS. 2 and 3) may have a control plane that allows users to monitor and/or configure various operating parameters of the link extender module 100 to make the link extender module 100 applicable for different link lengths and/or link characteristics. For example, for each of the channels (e.g., 8 channels) of the input optical signal to the link extender module 100, a user can monitor the input power and output power to the link extender module 100, as well as the input power and output power to the input and output VOAs. In some embodiments, the input/output VOAs can be used to set a constant input power into each channel or to deliver a constant output power. In some embodiments, the input/output VOAs can be used to set a constant gain. In some embodiments, the gain of the link extender module 100 can be controlled by changing the SOA current and keeping the input/output VOAs at a fixed input/output power. The control modes of the link extender module 100 can be manually configured (e.g., via a user) or implemented via a control algorithm.

In some embodiments, the link extender module 100 may also support temperature monitoring and support one or more alarms. For example, when input/output power thresholds are exceeded, the link extender module 100 may trigger an alarm state, where the SOAs are continuously monitored and kept in an operating state where a saturation effect is not present. Likewise, when the input power to the link extender module 100 is below a predefined threshold, the link extender module 100 firmware can turn off the SOAs (e.g., by switching OFF the single channel SOA current and/or by setting the VOA at its maximum value).

Figure 4:
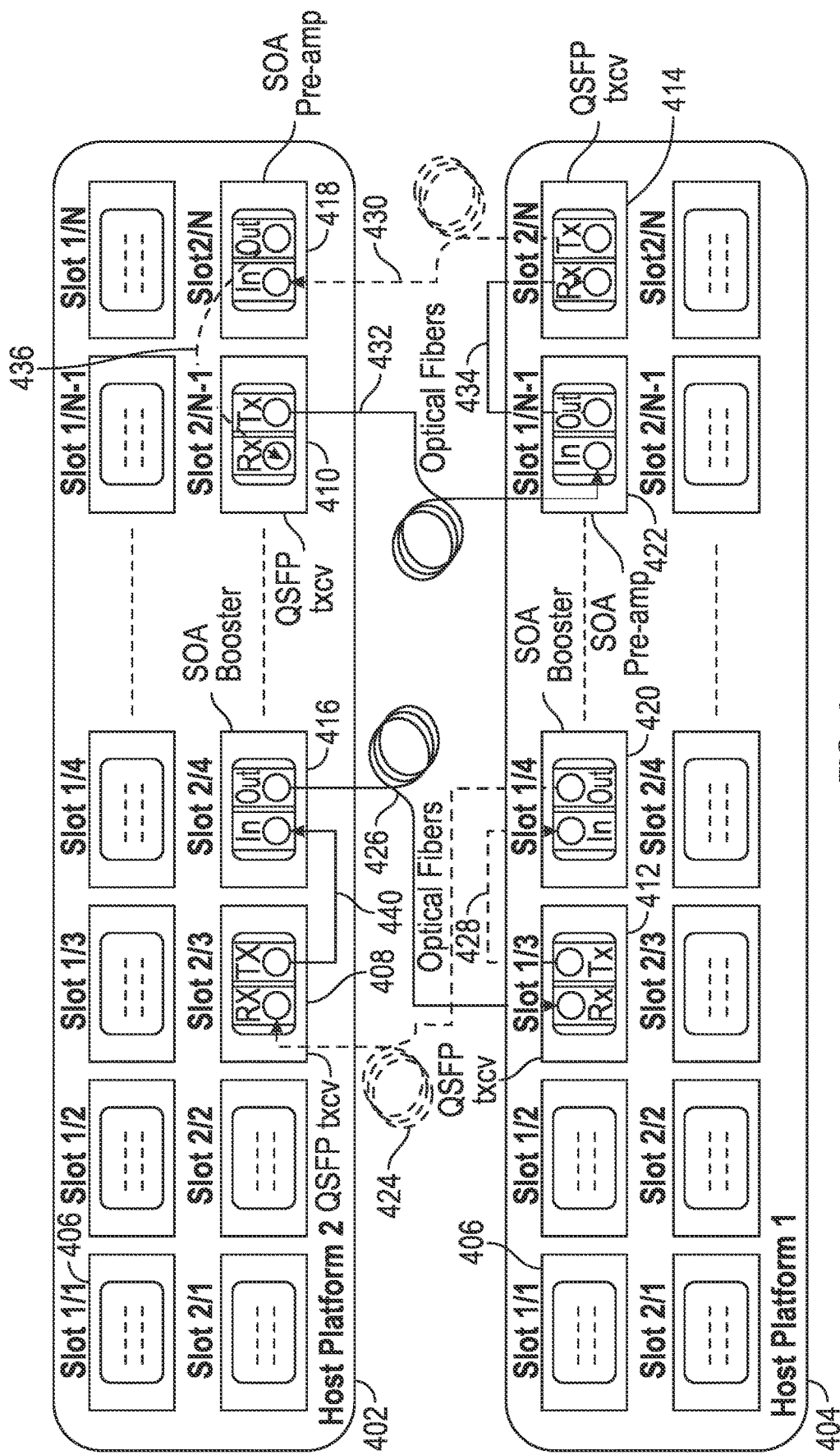
FIG. 4 illustrates an example application of the link extender module, according to embodiments of the present disclosure.

FIG. 4 illustrates an example application of the link extender module 100, according to one embodiment. Here, a host platform 402 and a host platform 404 include multiple slots 406 that can be used for optical transceivers and/or link extender modules 100. In this embodiment, an optical transceiver and a link extender module may be connected via a transmit optical fiber transporting the optical signal to be amplified or a receiver optical fiber transporting the amplified optical signal. The serial interface (e.g., I2C, SPI, MDIO, etc.) and power supply connection may be leveraged on the host platform for the optical transceiver. In this case, the power consumed by the optical transceiver can be imputed directly to the secondary slot where the link extender module is inserted.

As shown, host platform 402 includes an optical transceiver 408 (e.g., QSFP XCV) within slot 2/3 and an optical transceiver 410 within slot 2/N-1. Host platform 402 also includes a link extender module 416 within slot 2/4 and a link extender module 418 within slot 2/N. The link extender modules 416 and 418 may be similar to link extender module 100 described above. Host platform 404 includes an optical transceiver 412 within slot 1/3 and an optical transceiver 414 within slot 2/N. Host platform 404 also includes a link extender module 420 within slot 1/4 and a link extender module 422 within slot 1/N-1. The link extender modules 420 and 422 may be similar to link extender module 100 described above.

The optical transceiver 408 is configured to communicate with the optical transceiver 412. For example, the link extender module 416 (e.g., SOA booster) is used to amplify (or boost) the optical signal output from the optical transceiver 408. In particular, the link extender module 416 can receive the optical signal from the transmitter of the optical transceiver 408 via the optical fiber 440 and can transmit a boosted optical signal to the receiver of the optical transceiver 412 via the optical fiber 426. Likewise, the link extender module 420 (e.g., SOA booster) is used to amplify (or boost) the optical signal output from the optical transceiver 412. In particular, the link extender module 420 can receive the optical signal from the transmitter of the optical transceiver 412 via the optical fiber 428 and can transmit a boosted optical signal to the receiver of the optical transceiver 408 via the optical fiber 424.

Also, the optical transceiver 410 is configured to communicate with the optical transceiver 414. For example, the link extender module 418 (e.g., SOA booster) is used to amplify (or boost) the optical signal output from the optical transceiver 414. In particular, the link extender module 418 can receive the optical signal from the transmitter of the optical transceiver 414 via the optical fiber 430 and can transmit a boosted optical signal to the receiver of the optical transceiver 410 via the optical fiber 436. Likewise, the link extender module 422 (e.g., SOA booster) is used to amplify (or boost) the optical signal output from the optical transceiver 410. In particular, the link extender module 422 can receive the optical signal from the transmitter of the optical transceiver 410 via the optical fiber 432 and can transmit a boosted optical signal to the receiver of the optical transceiver 414 via the optical fiber 434.

Figure 5:
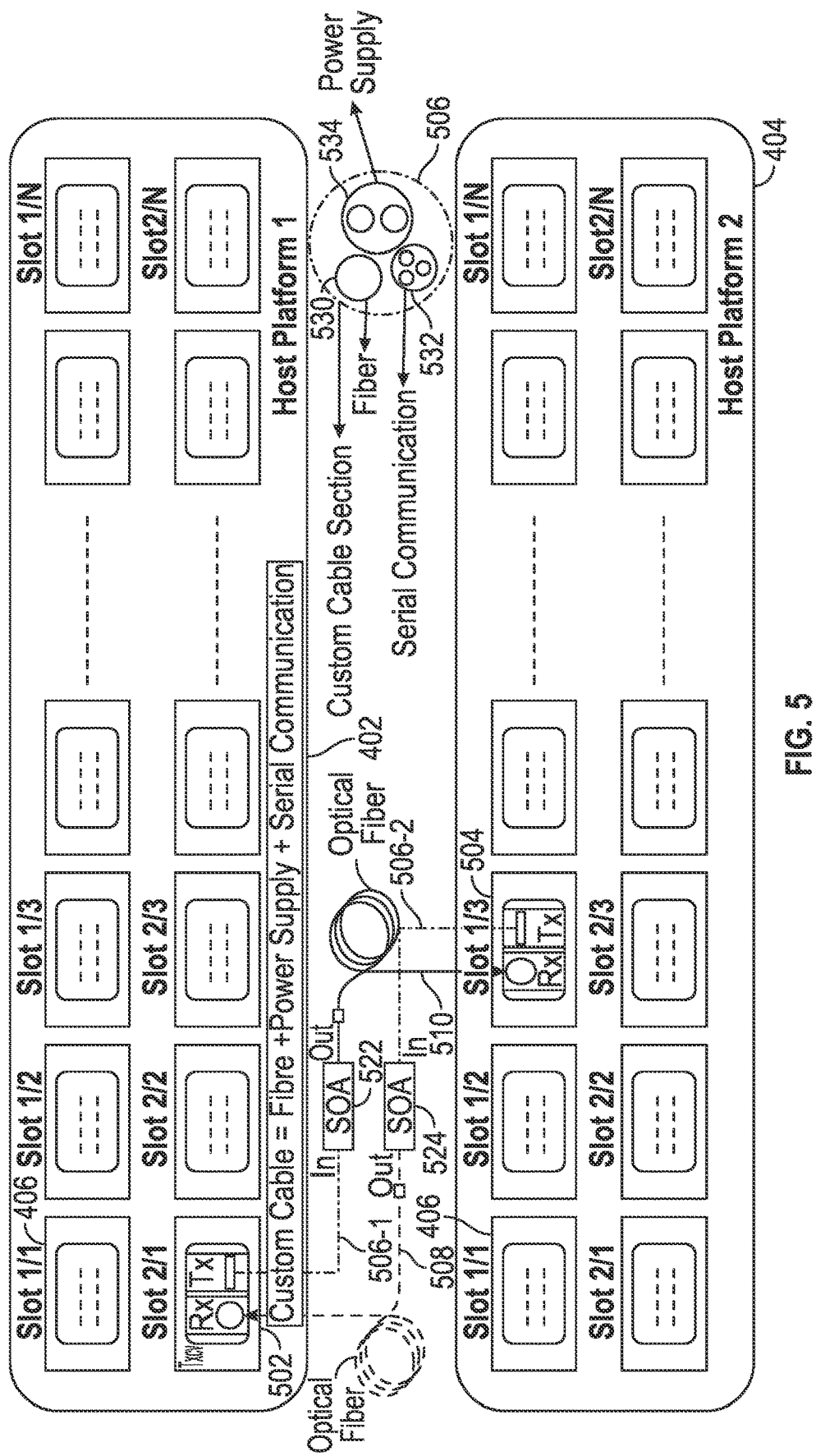
FIG. 5 illustrates another example application of the link extender module, according to embodiments of the present disclosure.

FIG. 5 illustrates another example application of the link extender module 100, according to one embodiment. Compared to the application depicted in FIG. 4, in this embodiment, the host platform 402 includes an optical transceiver 502 within slot 2/1 and the host platform 404 includes an optical transceiver 504 within slot 1/3.

In this embodiment, optical transceiver 502 and the optical transceiver 504 are configured to communicate via link extender modules 522, 524, which are configured as external units. The optical transceiver 502 is coupled to the link extender module 522 via cable 506-1, and the optical transceiver 504 is coupled to the link extender module 524 via optical fiber 510 (also referred to as a fiber cable or fiber optic cable). In particular, the transmitter of the optical transceiver 502 is configured to transmit an optical signal to the link extender module 522 via cable 506-1, and the link extender module 522 is configured to transmit a boosted optical signal to the receiver of the optical transceiver 504 via optical fiber 510. Likewise, the optical transceiver 502 is coupled to the link extender module 524 via optical fiber 508, and the optical transceiver 504 is coupled to the link extender module 524 via cable 506-2. The transmitter of optical transceiver 504 is configured to transmit an optical signal to the link extender module 524 via cable 506-2, and the link extender module 524 is configured to transmit a boosted optical signal to the receiver of the optical transceiver 502 via optical fiber 508.

In this external unit scenario, the cable 506 (e.g., cable 506-1 and/or cable 506-2) can be a custom cable (or custom connector) configured to connect the optical transceiver to the external link extender module. The cable 506 can include an optical fiber connector (e.g., receiver optical connector/fiber 530), a power supply 534, and one or more serial communication cables (or wires) 532.

Figure 6:
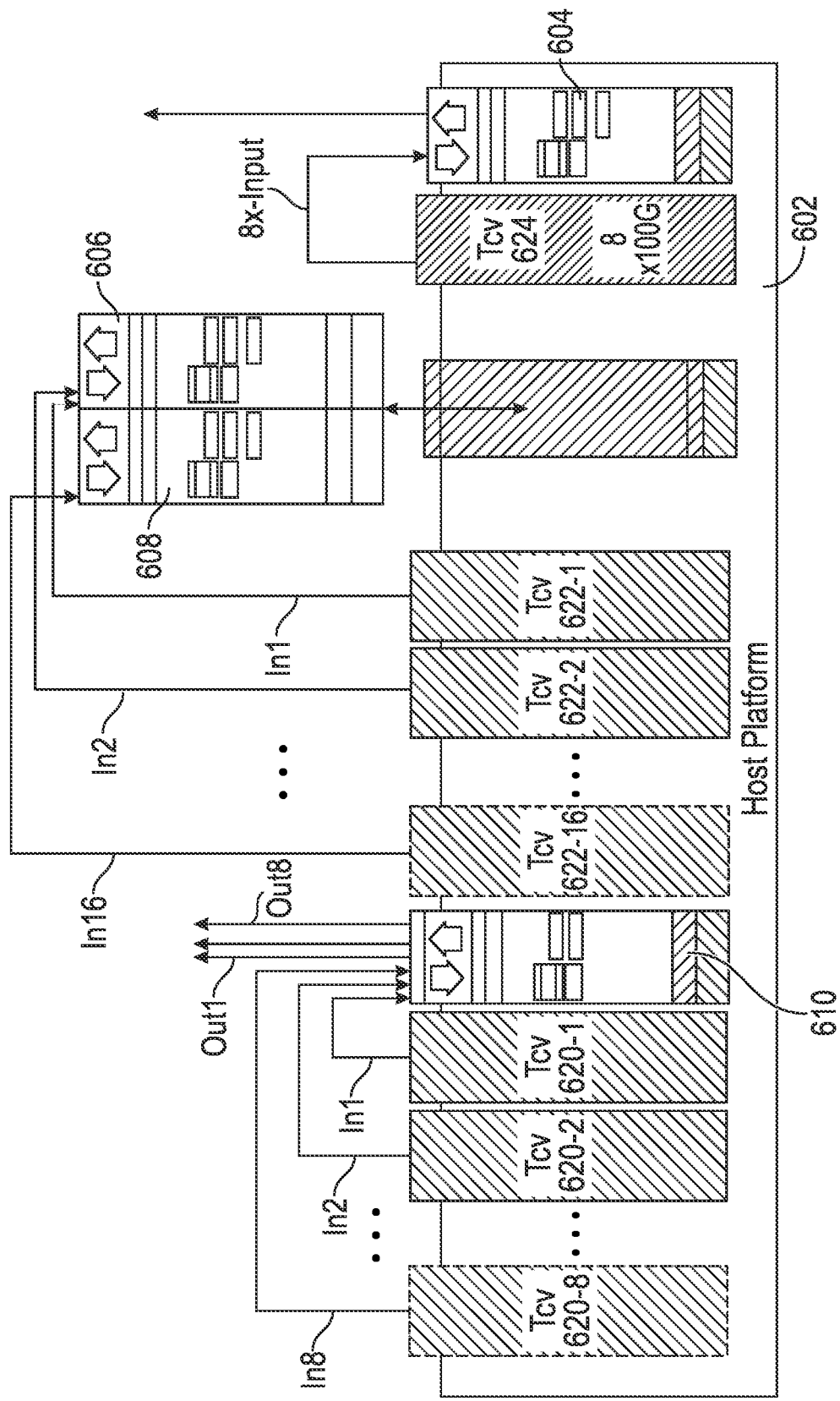
FIG. 6 illustrates another example application of the link extender module, according to embodiments of the present disclosure.

FIG. 6 illustrates another example application of the link extender module 100, according to one embodiment. As shown, the host platform 602 can support multiple optical transceiver modules 620, 622, and 624 and link extender modules 604, 606, 608, and 610.

In one embodiment, the link extender module 610 can be configured to amplify optical signals from multiple transceiver modules. For example, the link extender module 610 is configured to receive a different channel input of an optical signal from each of optical transceiver modules 620 1-8. As shown, the link extender module 610 receives Input 1 (In1) from optical transceiver module 620-1, Input 2 (In2) from optical transceiver module 620-2, and so on. The optical transceiver module 620-1 is configured to output an amplified optical signal with 8 channels (e.g., Output 1 (Out1) to Output 8 (Out8)). In another embodiment, the link extender module 604 can be configured to amplify an 8×100 G optical signal (e.g., 8× Input optical signal) received from a transceiver module 624.

In another embodiment, multiple link extender modules can be used to amplify optical signals from multiple transceiver modules. For example, the link extender module 606 is configured to receive a first subset of channels of an optical signal from transceiver modules 622 1-8 (e.g., Input 1 (In1) to Input 8 (In8) from transceiver modules 622 1-8, respectively) and the link extender module 608 is configured to receive a second subset of channels of the optical signal from transceiver modules 622 9-16 (e.g., Input 9 (In9) to Input 16 (In16) from transceiver modules 622 9-16, respectively).

In the current disclosure, reference is made to various embodiments. However, the scope of the present disclosure is not limited to specific described embodiments. Instead, any combination of the described features and elements, whether related to different embodiments or not, is contemplated to implement and practice contemplated embodiments. Additionally, when elements of the embodiments are described in the form of "at least one of A and B," it will be understood that embodiments including element A exclusively, including element B exclusively, and including element A and B are each contemplated. Furthermore, although some embodiments disclosed herein may achieve advantages over other possible solutions or over the prior art, whether or not a particular advantage is achieved by a given embodiment is not limiting of the scope of the present disclosure. Thus, the aspects, features, embodiments and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

As will be appreciated by one skilled in the art, the embodiments disclosed herein may be embodied as a system, method or computer program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system."

Aspects of the present disclosure are described herein with reference to flowchart illustrations and/or block diagrams of methods, apparatuses (systems), and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the block(s) of the flowchart illustrations and/or block diagrams.

These computer program instructions may also be stored in a computer readable medium that can direct a computer, other programmable data processing apparatus, or other device to function in a particular manner, such that the instructions stored in the computer readable medium produce an article of manufacture including instructions which implement the function/act specified in the block(s) of the flowchart illustrations and/or block diagrams.

The computer program instructions may also be loaded onto a computer, other programmable data processing apparatus, or other device to cause a series of operational steps to be performed on the computer, other programmable apparatus or other device to produce a computer implemented process such that the instructions which execute on the computer, other programmable data processing apparatus, or other device provide processes for implementing the functions/acts specified in the block(s) of the flowchart illustrations and/or block diagrams.

The flowchart illustrations and block diagrams in the Figures illustrate the architecture, functionality, and operation of possible implementations of systems, methods, and computer program products according to various embodiments. In this regard, each block in the flowchart illustrations or block diagrams may represent a module, segment, or portion of code, which comprises one or more executable instructions for implementing the specified logical function(s). It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

In view of the foregoing, the scope of the present disclosure is determined by the claims that follow.

We claim:

1. An apparatus configured to extend a range of an optical transceiver module, the apparatus comprising:
    an array of semiconductor optical amplifiers (SOAs) configured as a single-polarization SOA array and to amplify an optical signal received from the optical transceiver module;
    a first plurality of variable optical attenuators (VOAs) configured to control a power output of the amplified optical signal output from the array of SOAs;
    a second plurality of VOAs configured to control a power input of the optical signal into the array of SOAs; and
    a plurality of dispersion compensation and filtering (DC&F) devices configured to compensate for chromatic dispersion of the optical signal.

2. The apparatus of claim 1, wherein:
    the optical signal comprises a plurality of channels; and
    the array of SOAs are configured to amplify the optical signal at one or more of a plurality of different amplification levels.

3. The apparatus of claim 2, wherein an amplification of each channel of the optical signal is independently configurable.

4. The apparatus of claim 1, further comprising a plurality of polarization state rotator (PSRs) configured to control a polarization mode of the optical signal.

5. The apparatus of claim 1, wherein the single-polarization SOA array comprises, for each channel of the optical signal, (i) a first SOA configured to receive the optical signal in a first polarization mode and (ii) a second SOA configured to receive the optical signal in a second polarization mode.

6. The apparatus of claim 1, wherein:
    the apparatus comprises a Silicon Photonics (SiP) structure; and
    the first plurality of VOAs and the plurality of DC&F devices are bonded on the SiP structure.

7. An optical system comprising:
    a first transceiver module;
    a second transceiver module; and
    an apparatus configured to:
        receive a first optical signal from the first transceiver module;
        amplify the first optical signal using at least an array of semiconductor optical amplifiers (SOAs); and
        transmit the amplified first optical signal to the second transceiver module, wherein the apparatus comprises:
        the array of SOAs, wherein the array of SOAs is configured as a single polarization SOA array;
        a first plurality of variable optical attenuators (VOAs) configured to control a power output of the amplified first optical signal;
        a second plurality of VOAs configured to control a power input of the first optical signal into the array of SOAs; and
        a plurality of dispersion compensation and filtering (DC&F) devices configured to compensate for chromatic dispersion of the first optical signal.

8. The optical system of claim 7, wherein the first optical signal comprises a plurality of channels.

9. The optical system of claim 7, wherein the first optical signal comprises a single channel.

10. The optical system of claim 7, further comprising at least one third transceiver module, wherein the apparatus further comprises a fiber attachment unit (FAU) and is configured to:
    receive, via at least one first input of the FAU, at least one first channel of the first optical signal from the first transceiver module;
    receive, via at least one second input of the FAU, at least one second channel of a second optical signal from the at least one third transceiver module;
    amplify the at least one first channel of the first optical signal using at least one first SOA of the array of SOAs;
    amplify the at least one second channel of the second optical signal using at least one second SOA of the array of SOAs; and
    transmit the amplified at least one second channel of the second optical signal.

11. The optical system of claim 10, wherein:
    the first transceiver module is coupled to the apparatus via a custom connector; and
    the second transceiver module is coupled to the apparatus via a fiber cable.

12. The optical system of claim 11, wherein the custom connector comprises an optical fiber connector, a power supply, and one or more serial communication cables.

13. The optical system of claim 10, wherein:
    the first transceiver module and the apparatus are located in different slots of a first host platform; and
    the second transceiver module is located on a second host platform.

14. A method for extending a range of a first transceiver module, the method comprising:
    receiving, by a link extender apparatus, a first optical signal from the first transceiver module;
    amplifying, by the link extender apparatus, the first optical signal using at least an array of semiconductor optical amplifiers (SOAs); and
    transmitting, by the link extender apparatus, the amplified first optical signal to a second transceiver module, wherein the link extender apparatus comprises:
        the array of SOAs, wherein the array of SOAs is configured as a single polarization SOA array;
        a first plurality of variable optical attenuators (VOAs) configured to control a power output of the amplified first optical signal;
        a second plurality of VOAs configured to control a power input of the first optical signal into the array of SOAs; and
        a plurality of dispersion compensation and filtering (DC&F) devices configured to compensate for chromatic dispersion of the first optical signal.

15. The method of claim 14, wherein the first optical signal comprises a plurality of channels.

16. The method of claim 15, wherein the array of SOAs are configured to amplify the first optical signal at one or more of a plurality of different amplification levels.

17. The method of claim 16, wherein an amplification of each channel of the first optical signal is independently configurable.

18. The method of claim 14, wherein the link extender apparatus further comprises a plurality of polarization state rotator (PSRs) configured to control a polarization mode of the first optical signal.

19. The optical system of claim 7, wherein the array of SOAs are configured to amplify the first optical signal at one or more of a plurality of different amplification levels.

20. The optical system of claim 19, wherein an amplification of each channel of the first optical signal is independently configurable.

\* \* \* \* \*